(12) United States Patent
Migliori et al.

(10) Patent No.: US 10,003,483 B1
(45) Date of Patent: Jun. 19, 2018

(54) BIOLOGICALLY INSPIRED METHODS AND SYSTEMS FOR AUTOMATICALLY DETERMINING THE MODULATION TYPES OF RADIO SIGNALS USING STACKED DE-NOISING AUTOENCODERS

(71) Applicant: SPAWAR Systems Center Pacific, San Diego, CA (US)

(72) Inventors: Benjamin J. Migliori, San Diego, CA (US); Daniel J. Gebhardt, San Diego, CA (US); Daniel C. Grady, La Jolla, CA (US); Riley Zeller-Townson, Hampstead, NC (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/586,168

(22) Filed: May 3, 2017

(51) Int. Cl.
*H04L 1/20* (2006.01)
*H04L 27/00* (2006.01)
*H04B 1/00* (2006.01)
*G06N 99/00* (2010.01)
*H04L 27/14* (2006.01)
(Continued)

(52) U.S. Cl.
CPC .......... *H04L 27/0012* (2013.01); *G01R 29/06* (2013.01); *G06N 99/005* (2013.01); *H04B 1/0003* (2013.01); *H04B 17/309* (2015.01); *H04L 27/0008* (2013.01); *H04L 27/14* (2013.01)

(58) Field of Classification Search
USPC .......................... 375/224, 340, 324, 260, 219
See application file for complete search history.

(56) References Cited

U.S. PATENT DOCUMENTS

| 2002/0041639 A1* | 4/2002 | Krupezevic | H04B 1/16 375/324 |
| 2005/0084040 A1* | 4/2005 | Stewart | H04L 27/0012 375/324 |

(Continued)

OTHER PUBLICATIONS

O. Dobre et al., "Survey of automatic modulation classification techniques: classical approaches and new trends", IET Communications, vol. 1, No. 2, pp. 137-156, 2007.

(Continued)

*Primary Examiner* — Eva Puente
(74) *Attorney, Agent, or Firm* — SSC Pacific Patent Office; Arthur K. Samora; Kyle Eppele

(57) ABSTRACT

Class types of input signals having unknown class types are automatically classified using a neural network. The neural network learns features associated with a plurality of different observed signals having respective different known class types. The neural network then recognizes features of the input signals having unknown class types that at least partially match at least some of the features associated with the plurality of different observed signals having respective different known class types. The neural network determines probabilities that each of the input signals has each of the known class types based on strengths of the matches between the recognized features of the input signals and the features associated with plurality of different observed signals. The neural network classifies each of the input signals as having one of the respective different known class types based on a highest determined probability.

9 Claims, 10 Drawing Sheets

(51) Int. Cl.
*G01R 29/06* (2006.01)
*H04B 17/309* (2015.01)

(56) References Cited

U.S. PATENT DOCUMENTS

| | | | | |
|---|---|---|---|---|
| 2007/0230599 A1* | 10/2007 | Koga | ............... | H04L 27/2608 375/260 |
| 2008/0212659 A1* | 9/2008 | Usui | ............... | H04L 1/20 375/219 |
| 2010/0098193 A1* | 4/2010 | Liu | ............... | H04L 27/0012 375/340 |
| 2012/0027065 A1* | 2/2012 | Ray | ............... | H04L 27/2647 375/224 |

OTHER PUBLICATIONS

A. Polydoros and K. Kim, "On the detection and classification of quadrature digital modulations in broad-band noise", vol. 38, No. 8, pp. 1199-1211, 1990.
J. L. Xu, W. Su, and M. Zhou, "Likelihood-ratio approaches to automatic modulation classification", vol. 41, No. 4, pp. 455-469, 2011.
S. Soliman and S.-Z. Hsue, "Signal classification us- ing statistical moments", vol. 40, No. 5, pp. 908-916, 1992.
B. Ramkumar, "Automatic modulation classification for cognitive radios using cyclic feature detection", vol. 9, No. 2, pp. 27-45, 2009.
D. Hubel and T. N. Wiesel, "Receptive fields, binocular interaction and functional architecture in the cat's visual cortex", J. Physiol. (Lond.), vol. 160, pp. 106-154, 1962.
M. Ito and H. Komatsu, "Representation of an- gles embedded within contour stimuli in area V2 of macaque monkeys", J Neurosci, vol. 24, No. 13, pp. 3313-3324, 2004.
J. Hedgé and D. C. Van Essen, "Selectivity for complex shapes in primate visual area v2", J Neurosci, vol. 20, No. 5, pp. 61-66, 2000.
J. A. Endler, "Some general comments on the evolution and design of animal communication systems", Philosophical Transactions of the Royal Society of London B: Biological Sciences, vol. 340, No. 1292, pp. 215-225, 1993.
B. Olshausen and D. J. Field, "Emergence of simple- cell receptive field properties by learning a sparse code for natural images", Nature, vol. 381, No. 6583, pp. 607-609, 1996.
A. J. Bell and T. J. Sejnowski, "The "independent components" of natural scenes are edge filters", Vision research, vol. 37, No. 23, pp. 3327-3338, Dec. 1997.
B. A. Olshausen and D. J. Field, "Sparse coding of sensory inputs", Current Opinion in Neurobiology, vol. 14, No. 4, pp. 481-487, 2004.
M. Bhand et al., "Unsupervised learning models of primary cortical receptive fields and receptive field plasticity", in Advances in Neural Information Processing Systems 24, J. Shawe-taylor et al., Eds., 2011, pp. 1971-1979.
M. L. D. Wong and A. K. Nandi, "Automatic digital modulation recognition using artificial neural net- work and genetic algorithm", in Signal Processing, vol. 84, 2004, pp. 351-365.
M. W. Aslam, Z. Zhu, and A. K. Nandi, "Automatic modulation classification using combination of genetic programming and KNN", vol. 11, No. 8, pp. 2742-2750, 2012.
A. Nandi and E. Azzouz, "Modulation recognition using artificial neural networks", in Signal Processing, vol. 56, 1997, pp. 165-175.
http://www.gnuradio.org, Gnu radio website, accessed Jul. 2015.
P. Vincent et al., "Extracting and composing robust features with denoising autoencoders", Proc. 25th Int. Conf. on Machine Learning, pp. 1096-1103, 2008.
J. Duchi, E. Hazan, and Y. Singer, "Adaptive Subgradient Methods for Online Learning and Stochas- tic Optimization", Journal of Machine Learning Research, vol. 12, pp. 2121-2159, 2011.
L. Bottou, "Large-scale machine learning with stochastic gradient descent", in Proceedings of COMPSTAT'2010, Springer, 2010, pp. 177-186.
J. Moody et al., "A simple weight decay can improve generaliza- tion", Advances in neural information processing systems, vol. 4, pp. 950-957, 1995.
N. Srivastava et al., "Dropout: a simple way to prevent neural networks from overfitting" The Journal of Machine Learning Research, vol. 15, No. 1, pp. 1929-1958, 2014.
D. Erhan, A. Courville, and P. Vincent, "Why Does Unsupervised Pre-training Help Deep Learning?", Journal of Machine Learning Research, vol. 11, pp. 625-660, 2010.
P. Vincent et al., "Stacked denoising autoencoders: learning useful representations in a deep network with a local denoising criterion", J. Mach. Learn. Res., vol. 11, pp. 3371-3408, Dec. 2010.
H. Lee, C. Ekanadham, and A. Y. Ng, "Sparse deep belief net model for visual area v2", in Advances in Neural Information Processing Systems, 2008, pp. 873-880.
K. Burse, R. Yadav, and S. Shrivastava, "Channel equalization using neural networks: a review", vol. 40, No. 3, pp. 352-357, 2010.
L. Deng et al., "Recent advances in deep learning for speech research at Microsoft", in Int. Conf. Acoustics, Speech and Sig. Proc. (ICASSP), IEEE, May 2013, pp. 8604-8608.
G. Hinton et al., "Deep Neural Networks for Acous- tic Modeling in Speech Recognition: The Shared Views for Four Research Groups", vol. 29, No. 6, pp. 82-97, Nov. 2012.
J. Masci et al., "Stacked convolutional auto-encoders for hierarchi- cal feature extraction", in Artificial Neural Networks and Machine Learning—ICANN 2011, Springer, 2011, pp. 52-59.
W. Maass, "Networks of spiking neurons: the third generation of neural network models", Neural Networks, vol. 10, No. 9, pp. 1659-1671, 1997.
H. Paugam-Moisy and S. Bohte, "Computing with spiking neuron networks", in Handbook of Natural Computing, Springer, 2012, pp. 335-376.
G.-q. Bi and M.-m. Poo, "Synaptic modifications in cultured hip- pocampal neurons: dependence on spike timing, synaptic strength, and postsynaptic cell type", The Journal of Neuroscience, vol. 18, No. 24, pp. 10 464-10 472, 1998.
D. Goodman and R. Brette, "Brian: a simulator for spiking neural networks in python", Frontiers in Neuroinformatics, vol. 2, 2008.
J. M. Nageswaran et al., "A configurable simulation environment for the efficient simulation of large-scale spiking neural networks on graphics processors", Neural Networks, vol. 22, No. 5, pp. 791-800, 2009.
S. Thorpe, A. Delorme, and R. Van Rullen, "Spike-based strategies for rapid processing", Neural Net- works, vol. 14, No. 6, pp. 715-725, 2001.
J. P. Jones and L. A. Palmer, "An evaluation of the two-dimensional Gabor filter model of simple receptive fields in cat striate cortex", J. Neurophysiol., vol. 58, No. 6, pp. 1233-1258, 1987.
S. Mandal, S. M. Zhak, and R. Sarpeshkar, "Circuits for an rf cochlea", in Int. Symp. Circuits and Systems, IEEE, 2006.
B Migliori, R. Zeller-Townson, D. Grady, D. Gebhardt, "Biologi- cally Inspired Radio Signal Feature Extraction with Sparse Denois- ing Autoencoders", in Stat. ML, May 2016.
http://www.mathworks.com/help/nnet/examples/training-a-deep-neural-network-for-digit-classification.
html?requestedDomain=www.mathworks.com (accessed Feb. 19, 2017).

* cited by examiner

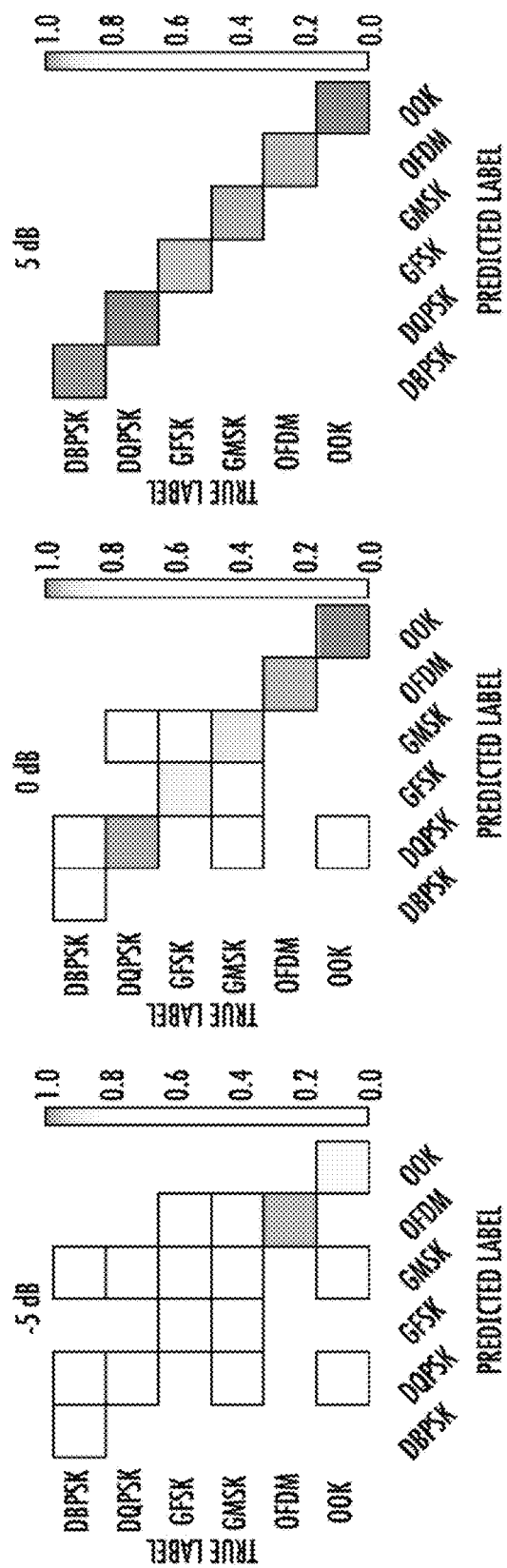

BIOLOGICALLY INSPIRED METHODS AND SYSTEMS FOR AUTOMATICALLY DETERMINING THE MODULATION TYPES OF RADIO SIGNALS USING STACKED DE-NOISING AUTOENCODERS

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 103946.

FIELD OF THE INVENTION

The present invention pertains generally to classification of input signals. More particularly, the present invention pertains to biologically-inspired classification of input signals based on recognized features of the input signals.

BACKGROUND OF THE INVENTION

Blind identification of signal modulations is a difficult task that bridges signal detection and the creation of useful information from received signals. This task is even more challenging in a non-cooperative or noisy environment with realistic channel properties, even with prior knowledge of the modulations to be detected. When such information is not available, classification is generally not feasible as most existing methods require prior information regarding the modulation mechanism.

Broadly, automatic modulation classification (AMC) techniques fall into two categories: likelihood-based (LB) and feature-based (FB). LB classification methodology is shown in FIG. 1A, and FB classification methodology is shown in FIG. 1B.

In the LB AMC methodology shown in FIG. 1A, modulation design knowledge 105 is used, along with signal models 130, noise models 120, and a cost function 140, to create a likelihood function of the input signals 150 belonging to a modulation. The likelihood function, in turn, is used to create a likelihood ratio, which is compared to a predetermined decision threshold in a likelihood test 160. The output 170 is an indication as to which modulation type the input signal belongs to. LB AMC is optimal from a theoretical Bayesian perspective, in that it minimizes the chance of a wrong classification. However, LB AMC has high computational complexity and requires careful design and selection of signal and noise models The FB AMC methodology shown in FIG. 1B uses expert-selected or designed signal features 135 based on known modulation characteristics 110 of expected modulations in a decision tree 165 with associated defined thresholds 145 to determine an output 175 of the modulation type of the input signals 150.

Conventional AMC methods, like the LB AMC method and the FB AMC method, require substantial design-side knowledge about the modulation properties and make specific assumptions regarding environmental noise. This requirement of advance expert knowledge makes these methods complex and largely unusable in noisy or uncooperative environments.

An AMC task can be contrasted with that of an animal moving within a natural environment. Animal sensory systems, such as vision and auditory sensing, have evolved over millions of years to detect, identify, and respond to novel events that could pose a threat or indicate a reward. As a result, when a new sound or sight is observed, most animals will make an immediate decision to classify it as friend, foe, or neutral. Animals perform this task without an explicit model or expert knowledge of the environment. Instead, they rely on previously learned low-level environmental features (such as edges and luminance transitions in vision) that generate activity in the different layers of neurons within the sensory cortex. As the information propagates through layers of the cortex, the concepts that the neurons are sensitive to become more and more abstract. Decisions based on these hierarchical features (referred to as receptive fields or weight values) are what allow the animal to make the friend-foe decision. This decision can be made without having prior knowledge of the exact input properties and in the presence of noise or corruption. Further, the process is naturally suited to non-cooperative environments.

In view of the above, it would be desirable to have a biologically inspired automatic classification method, device, and system that do not require advance expert knowledge or complicated models and that function well in a noisy, non-cooperative environment.

SUMMARY OF THE INVENTION

According to an illustrative embodiment, a method, device and system are provided for automatically classifying feature types of input signals having unknown feature types. Features associated with a plurality of different observed signals having respective different class types are learned by a neural network. The neural network then recognizes features of the input signals having unknown class types that at least partially match at least some of the features associated with the plurality of different observed signals having respective different known class types. The neural network determines probabilities that each of the input signals has each of the known modulation types based on strengths of matches between the recognized features of the input signals and the features associated with the plurality of different observed signals. The neural network classifies each of the input signals as having one of the respective different known class types based on a highest determined probability.

These, as well as other objects, features and benefits will now become clear from a review of the following detailed description, the illustrative embodiments, and the accompanying drawings.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which:

FIG. 10 illustrates a biologically-inspired automatic classification method according to illustrative embodiments.

FIGS. 6A-6C illustrate confusion matrices for each modulation family as classified by a classification system according to an illustrative embodiment.

DETAILED DESCRIPTION OF THE EMBODIMENTS

According to an illustrative embodiment, a method, device and system are provided for automatically classifying feature types of input signals having unknown feature types. Features associated with a plurality of different observed signals having respective different class types are learned by a neural network. The neural network then recognizes features of the input signals having unknown class types that at least partially match at least some of the features associated with the plurality of different observed signals having respective different known class types. The neural network determines probabilities that each of the input signals has each of the known modulation types based on strengths of matches between the recognized features of the input signals and the features associated with the plurality of different observed signals. The neural network classifies each of the input signals as having one of the respective different known class types based on a highest determined probability.

The method, device and system are accurate in noisy environments and can be considered to be biologically inspired in that they "learn" modulation types much in the same way an animal might learn patterns without advance knowledge.

Although modulated radio signals are in many ways quite different from the signals that biological neural systems have evolved to detect and process, they nonetheless propagate through an environment that produces many biologically relevant sources of noise. It is reasonable to consider whether principles of biological sensing may lead to useful alternatives to existing statistical approaches for radio signal processing. As demonstrated below, the architecture for classifying modulation types according to illustrative embodiments does generate useful receptive fields that allow classification methods to better discriminate amongst classes.

The approach described herein differs significantly from conventional approaches to automatic modulation classification in that it is model-free and expert-free on the ingest side, and requires only on example signals to detect future signals modulated in the same manner. This stands in sharp contrast to the conventional LB and FB AMC methods which, as noted above, require expert input at each stage.

Figure 1A:
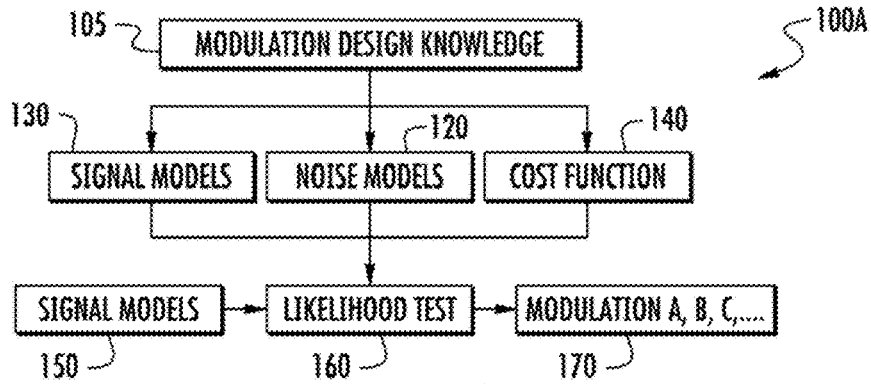
FIG. 1A illustrates a conventional likelihood-based modulation classification method.
Figure 1B:
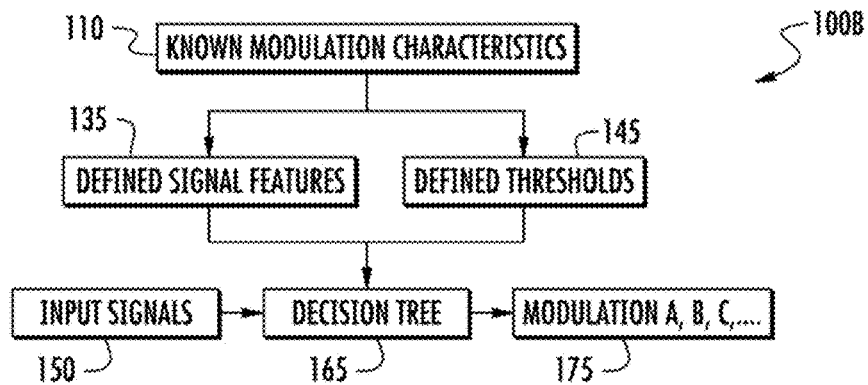
FIG. 1B illustrates a conventional feature-based modulation classification method.
Figure 1C:
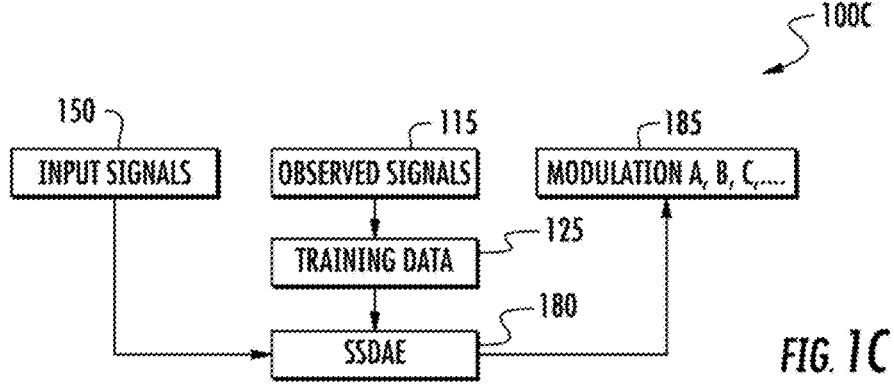

For example, referring to FIG. 1C, which illustrates a biologically inspired automatic classification methodology according to illustrative embodiments, observed signals 115 are used to develop a training set 125 of data. The training set 125 is used to train an autoencoder (referred to herein as a stacked sparse denoising autoencoder (SSDA) and described in detail below) 180 to determine the modulation type of input signals 150. The determined modulation type is output at 185.

As can be seen from FIG. 10, expert situational knowledge is not required for the biologically inspired modulation classification methodology according to illustrative embodiments. Instead, only observational data is used.

To aid in understanding of the modulation classification performed according to illustrative embodiments, a problem formulation is presented below. Consider a deterministic system M which accepts a signal s and emits a prediction M(s) with which one of a fixed number $N_{mod}$ of modulation families s is encoded. Letting (s) be the true modulation of s, one way to characterize M is with its full joint distribution, where $P_c^{(i'|i)}$ represents the probability of correct prediction for a given signal and is given by:

$$P_c^{(i'|i)} = \text{Prob}[M(s)=i' \text{ and } T(s)=i] \quad (1)$$

A measure of the performance of M is the average correct classification across all tested modulation families, $P_{cc}$:

$$P_{cc} = \frac{1}{N_{mod}} \sum_{i=1}^{N_{mod}} P_c^{(i|i)} \quad (2)$$

Cases are also considered in which $P_{cc}$ is allowed to be a function of signal to noise ratio (SNR).

Figure 2A:
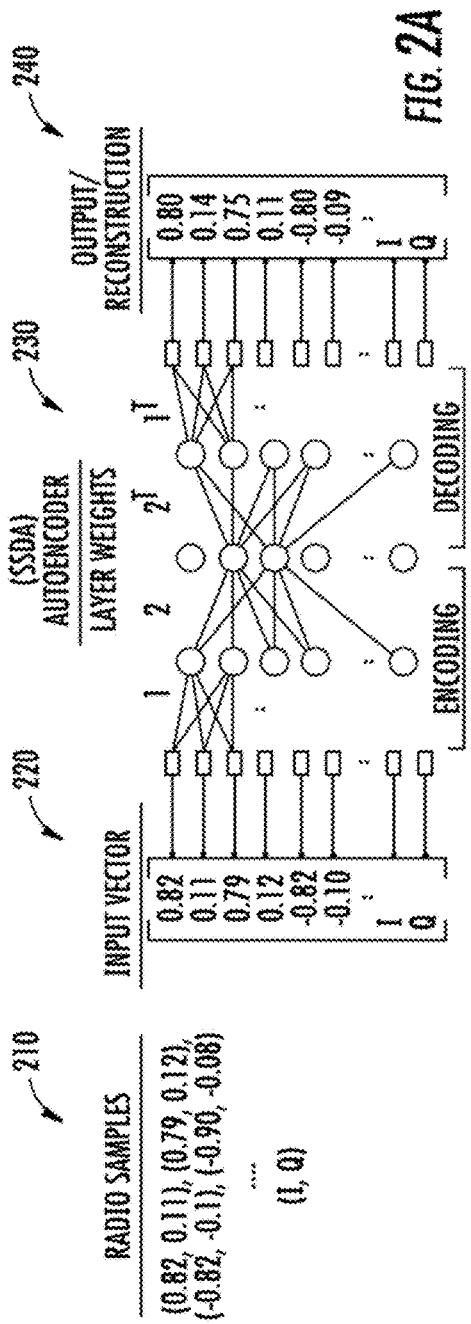
FIG. 2A illustrates an example configuration for an unsupervised training phase according to illustrative embodiments.
Figure 2B:
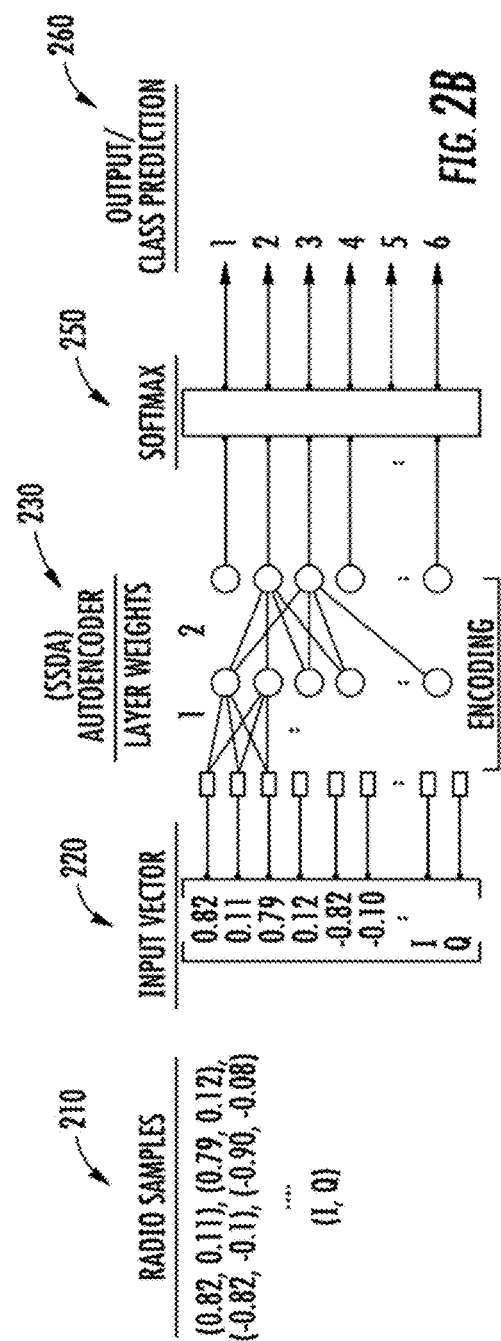
FIG. 2B illustrates an example classifier configuration for a supervised training phase and for post-training classification according to illustrative embodiments.

According to illustrative embodiments, the automatic modulation classification methodology relies on a deep neural network, shown as an autoencoder 230 in FIGS. 2A and 2B. FIG. 2A shows the neural network configuration used during unsupervised pre-training of the autoencoder 230. FIG. 2B shows a neural network configuration used during supervised fine-tuning of the autoencoder 230 and post-training classification of input signals by a softmax 250.

Referring first to FIG. 2A, the autoencoder 230 receives radio samples 210 having known modulation types. The radio samples are converted into vectors 220 as described in detail below. Although not shown, the radio samples may be filtered during a pre-processing step using a zero-phase component analysis (ZCA) whitening filter or other whitening filter in a manner which one skilled in the art would understand.

According to illustrative embodiments, the autoencoder 230 includes inputs, multiple hidden layers, e.g., Layer 1 and Layer 2, and outputs. Each hidden layer includes weighted connections going into or coming out of neurons. The values coming into neurons are multiplied in the neurons by the weights of the connections through which they enter the neurons. Thus, each neuron has a number of weights or weight values, also called receptive fields. The neurons output a strong signal when a feature of the input signal matches the feature corresponding to a receptive field of the neuron. That is, the stronger the similarity or match between a feature of an input signal to the feature corresponding to a receptive field of a neuron, the stronger the signal output by the neuron.

The weights of the connections may be set initially based on observed characteristics associated with the known modulation types. By adjusting the weights of the connections through training of the autoencoder 230, the neurons can be tuned to respond to particular characteristics of the input signals, e.g., to produce strong outputs when input signals have features that correspond to (or strongly match) features of signals having known modulation types.

As noted above, according to illustrative embodiments, training includes two stages: unsupervised pre-training and supervised fine-tuning.

Referring to FIG. 2A, during initial unsupervised training, the autoencoder 230 is trained in an unsupervised manner by comparing the output vector (reconstruction) 240 to the input vector 220 and using the difference to adjust the assigned autoencoder connection weights. This may be performed using a standard back-propagation training method, working from the output through the hidden layers to the input, going backward, in other words. Throughout the pre-training process, back-propagation causes the autoencoder 230 to "learn" the features of the input signals, reducing the difference between actual and intended outputs until the difference is minimized. In the configuration shown in FIG. 2A, this back-propagation process works through the use of encoding and decoding stages. The encoder maps inputs to a hidden layer representation, and the decoder attempts to reverse this mapping to reconstruct the original inputs. In FIG. 2A, the decoding layer weights with a superscript "T" indicate the transposed weight values of the encoding weights. It should be appreciated that these weight values could also be separate and unique from the encoding weights. Back-propagation is repeated for a predefined number of samples or a predefined amount of time to minimize the difference between the input and the output, such that the output is substantially the same as the input.

Once the unsupervised training is completed, the configuration shown in FIG. 2B is used in a supervised training stage to fine-tune the connection weights of the autoencoder 230. During the supervised fine-tuning phase, the decoding layers of the autoencoder 230 are removed. A softmax 250 predicts probabilities that the input signals of the autoencoder 230 have each of the known modulation types based on the outputs of the autoencoder 230. The softmax 250 determines, for each output of the autoencoder 230, whether the highest predicted probability corresponds to the actual known modulation type of the input signal and repeatedly refines the weights of the connections of autoencoder 230 until the highest predicted probability is substantially correct. Layer weights of the autoencoder 230 are refined with supervised back-propagation using the known modulation types. This supervised fine-tuning by the softmax 250 may be thought of as an organization of the unsupervised outputs of the autoencoder 230 into a multi-layer perceptron, as described in further detail below.

Once the autoencoder 230 is trained, the weight values (also referred to as receptive fields) of the neurons will correspond to features of signals having known modulation types. Thus, when new input signals having unknown modulation types enter the neurons of the autoencoder 230, the neurons will output strong signals for those input signals that have features that substantially "match" the features corresponding to the weight values. Through unsupervised training and fine-tuning, the autoencoder 230 "learns" different features of signals that are associated with different known modulation types, outputting signals having features that substantially match features of at least one known modulation type.

Once the autoencoder 230 is fine-tuned, it can be used along with the softmax 250 in the configuration shown in FIG. 2B to classify the modulation types of radio samples. Although the radio samples shown in FIG. 2A are the same as those shown in FIG. 2B, it should be appreciated that the classification system, once trained, can be used to classify the modulation types of radio samples that are modulated with any type of modulation (known or unknown). The trained autoencoder 230 recognizes features of the input signals that at least partially match at least some of the features associated with the different known modulation types. The autoencoder 230 then outputs signals indicative of strengths of matches between the recognized features of the input signals and the features associated with the different known modulation types. The softmax 250 examines each of the outputs of the autoencoder 230 and determines probabilities that each of the outputs have modulation types corresponding to each of the known modulation types. The softmax 250 determines the modulation type that input signal corresponding to the output signal is modulated by, based on the highest computed probability. The result is output as a human-readable class ID or label 260 which identifies the modulation type of the input signal.

Although only one autoencoder 230 is shown in FIGS. 2A and 2B, the neural network configuration may include a series of pre-trained sparse denoising autoencoders (SDAs). According to illustrative embodiments, the autoencoders are configured with sparsity across neuron and noise corruption between layers. The softmax 250 is configured to use a regularization constraint during refinement of the autoencoder weights.

The architecture depicted in FIG. 2B was tested using radio data that included synthetically generated radio signals, transmitted and received, but clean of outside interference. A GNU Software Defined Radio (SDR) framework was used to construct the modulations that generated this data.

A binary file, produced by randomly choosing byte values, was used as the signal input. This binary data was modulated as in-phase and quadrature I/Q samples using each of six modulation methods including: on-off keying (OOK), Gaussian frequency-shift keying (GFSK), Gaussian minimum-shift keying (GMSK), differential binary phase-shift keying (DBPSK), differential quadrature phase-shift keying (DQPSK), and orthogonal frequency-division multiplexing (OFDM).

For each modulation, the samples were upconverted to the carrier frequency by a BladeRF™ SDR. The SDR was configured in RF loop-back mode, such that the RF signal was sent and received only within the device's circuitry, and not to an external antenna. This arrangement provides added realism by incorporating the upconversion and radio effects, but without unwanted third-party signals that could pollute the controlled testing.

The signal sampling rate was set so that the number of samples per symbol ($N_{Sps}$) was consistent for every modulation type, except for OFDM. In contrast with the other modulation techniques, OFDM encodes data on multiple carrier frequencies simultaneously, within the same symbol, and modulates each carrier frequency independently. For experimental purposes, an existing OFDM signal processing component was used that operates with a symbol rate different than the other configurations, but with the same sample rate. This rate is identical for both the transmission and reception of the signal. The received RF signal was down-converted at the radio and the resulting I/Q samples were stored for analysis.

For generation and preprocessing of training data, data files need to be arranged into a format and structure for use by the neural network. For this purpose, the I/Q data was split into segments consisting of $N_{S\rho}v$ samples, or samples per vector. A segment is composed of interleaved I and Q values for each sample, forming a vector of length $2 \times N_{S\rho}v$. Thus, each vector contained $N_{S\rho V}/N_{S\rho S}$ symbols. These vectors were placed into two sets, train and test (sizes $N_{Vtrain}$ and $N_{Vtest}$), such that both the modulation type and positions within the set were random. The parameter $N_{S\rho V}$ is identical for each modulation type for all the experiments described herein. The specific values of all parameters are shown in Table I. It should be appreciated that these parameters are shown by way of example, and that other parameters could be used.

TABLE I

| Description | Parameter | Value |
|---|---|---|
| samples per symbol | $N_{SpS}$ | 10 |
| samples per vector | $N_{SpV}$ | 100 |
| number of training vectors | $N_{Vtrain}$ | 60000 |
| number of training vectors per modulation | $N_{Vmod}$ | 10000 |
| number of test vectors | $N_{Vtest}$ | 10000 |

Starting from a signal sample vector s as described above, the input units of the first autoencoder may be set to values given by x, where x may be computed as $x = Z \cdot s$. Then, the values of the hidden layer units within the autoencoder may be calculated according to:

$$y = \sigma(W \cdot c(x) + b_v) \tag{3}$$

and the values of the output units are calculated as:

$$z = \sigma(W^T \cdot y + b_h) \tag{4}$$

Here, $\sigma$ is a non-linear activation function that operates element-wise on its argument, and c is a stochastic "corruptor" which adds noise according to some noise model to its input. The function c is non-deterministic. That is, c may corrupt the same sample vector x in different ways every time x is passed through it. As noted above, after training, the decoding output layers of the autoencoder are discarded. For a system having stacked autoencoders, the hidden layer activations are then used as the input layer to the next autoencoder.

An overly sparse or compact representation may be unable to distinguish between identical modulations shifted in time. Thus, the number of neurons on the first and second layers were chosen such that with fully sparse activation constraints (5% of total neurons), there would still be a significant number of neurons active for a given sample (i.e. ~25).

The parameters of a single autoencoder are the weight matrix W and bias vectors $b_v$ and $b_h$. According to illustrative embodiments, these parameters are adjusted via unsupervised pre-training so that the output layer reproduces the input as precisely as possible while also subjecting it to a constraint designed to encourage "sparse activation" of hidden layer units, that is, to encourage hidden layer unit activations to remain near 0 except for a small fraction. The overall cost function for a single autoencoder layer is:

$$J(W, b_v, b_h) = <\|z_i - x_i\|^2>_T + \beta \Sigma_k KL(\rho, \rho_k) \tag{5}$$

Here, i indexes over data vectors and k indexes over hidden layer units. Parameters $\beta$ and $\rho$ are weighting and sparsity parameters, respectively, $x_i$ is the i-th data vector, $z_i$ is the corresponding output layer activation, $\rho_k$ is the average activation level of the k-th hidden unit over all data vectors, and $$KL(\rho, \rho_k) = \rho \log \frac{\rho}{\rho_k} + (1 - \rho) \log \frac{1 - \rho}{1 - \rho_k)}$$

is recognized as the Killback-Leibler divergence.

The hidden layer activations of one autoencoder can be supplied as the input to another autoencoder, leading to a stacked architecture. Denoting the input, hidden, and output units of a single autoencoder at layer l as $x^{(l)}$, $y^{(l)}$, $z^{(l)}$ respectively, then the process of forward propagation through the entire network of autoencoders proceeds sequentially according to:

$$y^{(l)} = \sigma(W^{(l)} \cdot c_l(y^{(l-1)}) + b_v^{(l)}) \tag{6}$$

for l=1 . . . L, and with the convention that $y^{(0)}$ is the input layer.

Sequential, unsupervised training of individual autoencoder layers was conducted using stochastic gradient descent with a batch size of 100 and the AdaGrad method, based on the I/Q data set described previously. The parameters used in this example for training are listed in Table II below. It should be appreciated that these parameters are provided by way of example, and that other parameters may be used.

TABLE II

| Description | Symbol | Value |
|---|---|---|
| activation function | $\sigma$ | tanh |
| layer 1 corruption | $c_1$ | Bernoulli, $p_{flip} = 0.2$ |
| layer 2 corruption | $c_2$ | Bernoulli, $p_{flip+6} = 0.3$ |
| layer 1 sparsity target | $\rho_1$ | 0.05 |
| layer 2 sparsity target | $\rho_2$ | 0.00 |

The unsupervised pre-training phase was followed with supervised fine-tuning. For this phase, the pre-trained autoencoders were organized into a purely feed-forward multi-layer perceptron according to Equation 6, with an additional final layer given as:

$$y^{(L)} = \text{softmax } \sigma(W^{(L)} \cdot (y^{(L-1)}) + b^{(L)}) \tag{7}$$

where L is the total number of layers.

Interpreting the final output vector of the multilayer perceptron as a probability distribution over modulation families, supervised learning attempts were made to minimize the negative log-likelihood function with an additional L2 regularization term to encourage the model to retain the sparsely activating features learned during the unsupervised phase. The regularization term A was set to a value of 1 or 0, depending on the desired experiment configuration. Explicitly, where n is the list of samples, L is the total number of layers, $y^{(l)}$ is the output of layer l, and $W^{(l)}$ indicates the weight matrix between layers l and l+1, the loss function of the multi-layer perceptron is given by:

$$J = -\frac{1}{n} \sum_{i=1}^{n} \left( \log \frac{e^{y_i^{(L)}}}{\sum_{m=1}^{s_L} e^{y_{m_i}^{(L)}}} \right) + \lambda \sum_{l=0}^{L-1} \sum_{k=1}^{s_l} \sum_{j=1}^{s_{l+1}} (W_{jk}^l)^2 \tag{8}$$

where $t_i$ indicates the index corresponding to the current label for sample i, and $s_I$ is the number of units in layer I.

Equation 8 can be minimized using batch stochastic gradient descent, resulting in the architecture as shown in FIG. 2B.

To assess the performance of the system with a more realistic channel model, the test data set was altered with additive white Gaussian noise (AWGN). These data configurations were used as input in a purely feed-forward mode, in that the system was not re-trained, and its modulation classification output evaluated. AWGN was added to each set of signal modulation types, such that for each set the resulting signal-to-noise ratio (SNR) matches a given value. This was necessary since each modulation type, as sampled by the radio, had different average power levels. For each of these signal modulation sets, $\{S_{mod}\}$, the added noise power, $P_{noise}$ is:

$$P_{noise} = \beta \cdot \frac{1}{N_{s(mod)}} \sum_{S_{mod}} \frac{1}{T} \sum_{t=1}^{T} (s_t)^2 \qquad (9)$$

where $N_{s(mod)}$ is the number of sample vectors for a particular modulation, $s_t$ is an individual signal sample vector of length $\tau$, and $\beta$ is a factor chosen such that 10 log ($P_{\{S\}}/P_{noise}$) matches the desired SNR.

Figure 3A:
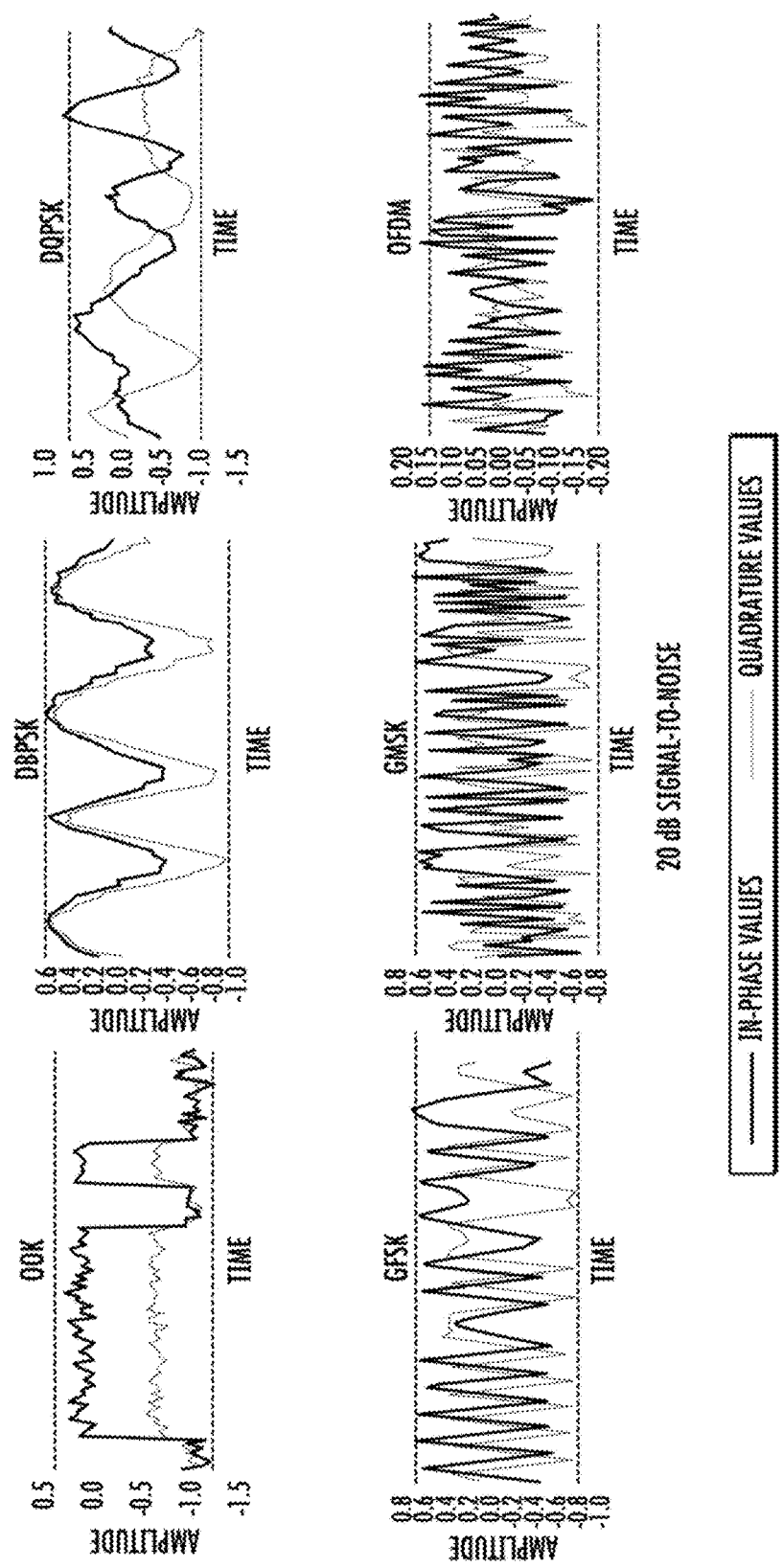
FIGS. 3A-3C illustrates examples of input vectors of radio signals of different modulation types under different signal-to-noise ratios.
Figure 3B:
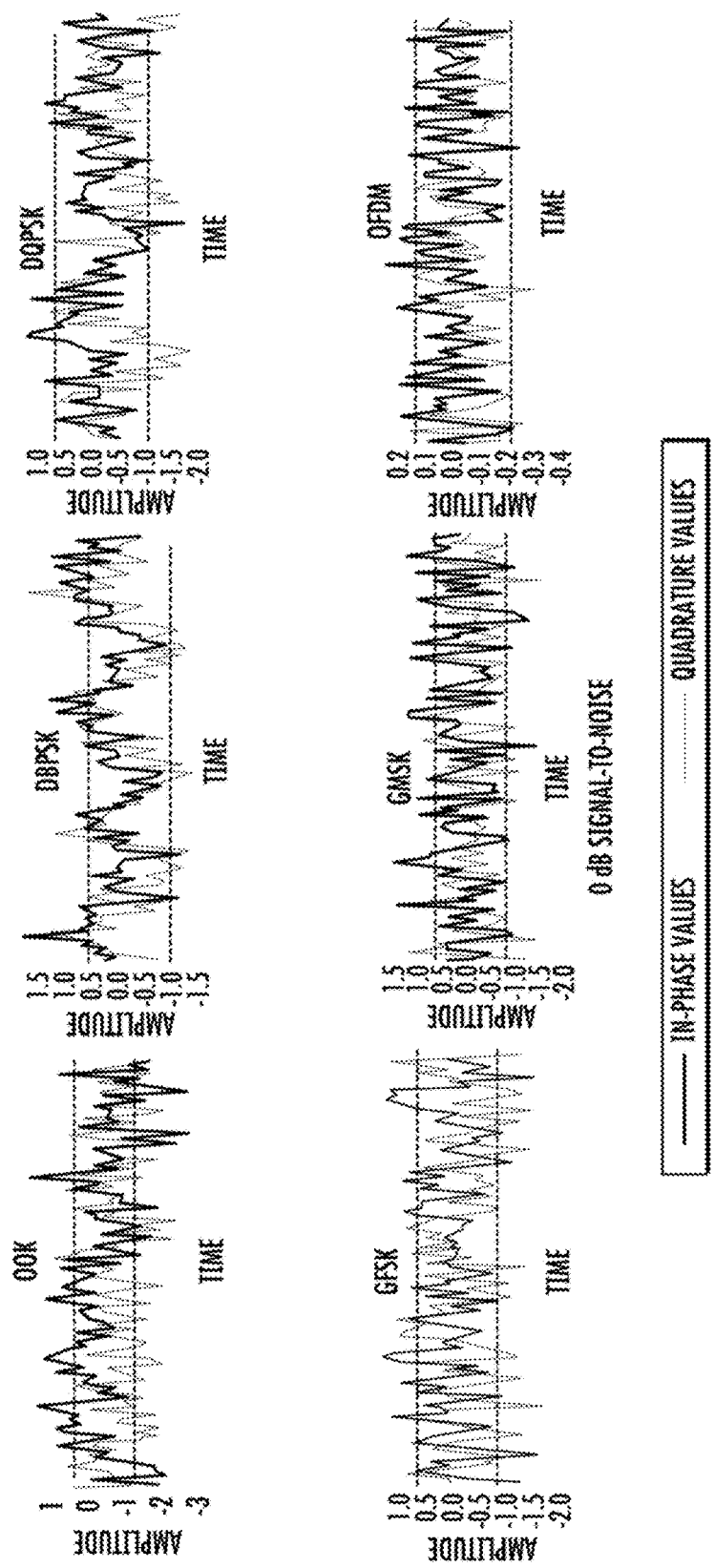
Figure 3C:
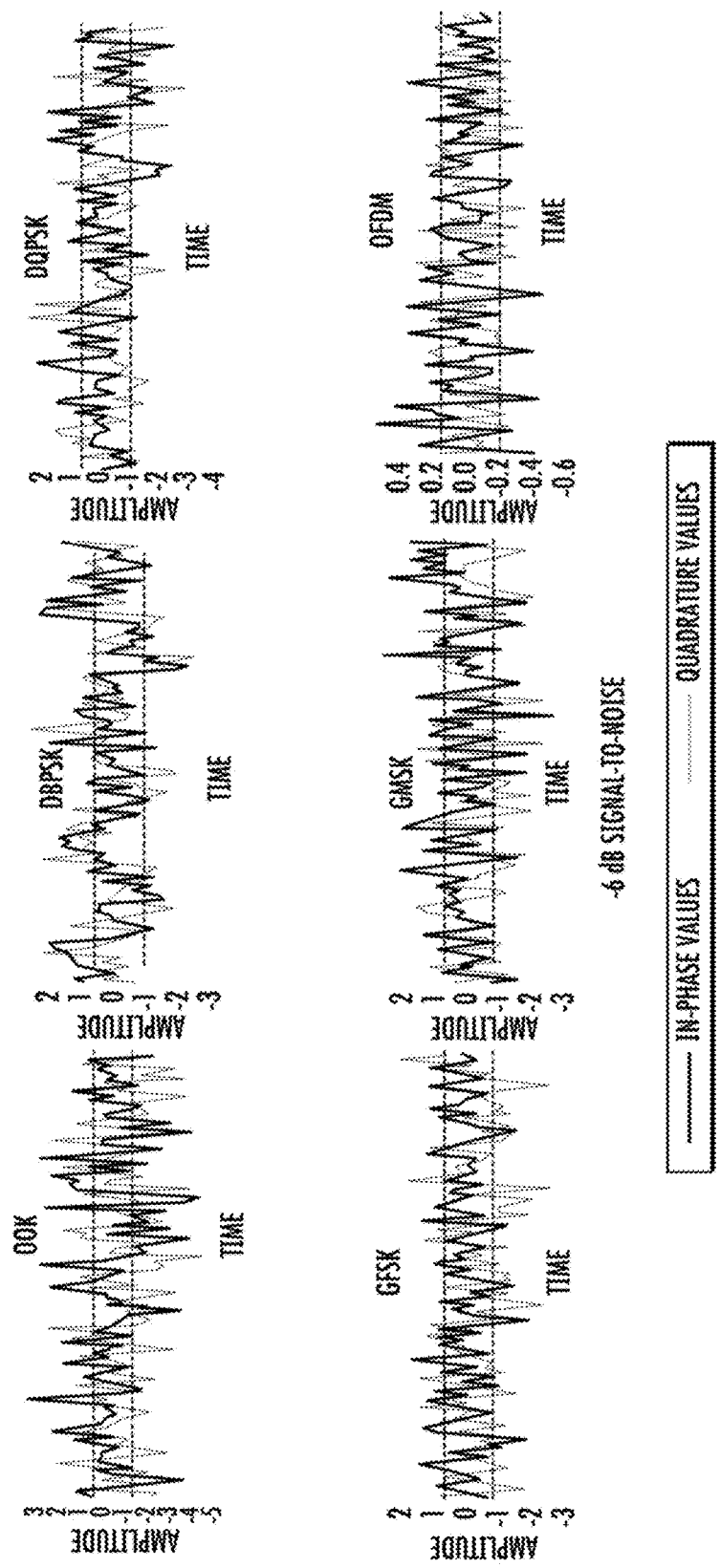

Examples of modulated data input vectors with the addition of noise are shown in FIGS. 3A-3C for each of the modulation types OOK, DBPSK, DQPSK, GFSK, GMSK, and OFDM. In each of these figures, the in-phase values are represented by dark lines, and the quadrature values are represented by lighter lines. Each figure represents 100 (I,Q) samples. The dashed lines in each figure indicate the envelope of the 20 dB SNR signals. In FIG. 3A, the modulated data input vectors for each modulation type are shown with a 20 dB SNR. In FIG. 3B, the modulation data input vectors are shown with a 0 dB SNR. In FIG. 3C, the modulation data input vectors are shown with a −6 dB SNR. It should be noted that all of the modulated vectors exhibited similar transmitted power with the exception of OOK, which had a slightly larger transmitted power.

The overall classification accuracy $P_{cc}$ (Equation 2) was measured for architectures which varied in the number of layers and the types of costs enforced during training. A cost for non-sparse activation was used as an L1 penalty (sparsity), and a cost for weight magnitude was used as an L2 penalty (weight decay). The architectures were chosen to study the effects of adding additional regularizations on the ability of the system to classify radio modulations.

For illustrative purposes, seven architectures were explored as summarized in Table III below. These architectures included a simple softmax classifier, a multi-layer perceptron (MLP) without pre-training, a single layer denoising autoencoder architecture A without sparsity or L2 regularization (weight decay), a single layer denoising autoencoding architecture B with sparsity and L2 regularization (weight decay), a double layer denoising autoencoder architecture C without sparsity and L2 regularization (weight decay), a double layer denoising autoencoder architecture D with sparsity and L2 regularization (weight decay), and a deep five layer denoising autoencoder architecture E with regularization (weight decay). The exact number of neurons (500 in layer 1 and 2, 250 in layers 3 and 4, and 100 in layer 5) was chosen arbitrarily to conform to available computing resources. To prevent learning of a trivial mapping, either the layer-to-layer dimensionality or sparsity constraint was altered between each pair of layers.

The misclassification rates for each of the experimental architectures are shown in Table III. As can be seen from Table III, architectures A, C, D, and E performed approximately two orders of magnitude better than the softmax classifier alone on the test set in the absence of noise. With both L2 regularization and sparsity constraints, the number of training examples required to obtain convergence increased, and in particular architecture D required significantly more than the others. However, this was offset by the increased performance of architecture D in the presence of channel noise.

TABLE III

| Label | $P_{cc}$ (%) | $P_{cc}$ (0 dB)(%) | Neurons ($N_1/N_2$) | Sparsity ($\rho_1/\rho_2$) | Regularization |
|---|---|---|---|---|---|
| Softmax Only | 46.9 | 36.0 | —/— | —/— | N/A |
| MLP only | 55.6 | — | —/— | —/— | Yes, Dropout |
| A | 99.91 | 64.9 | 500/— | 0.05/— | No |
| B | 90.8 | 73.0 | 500/— | 0.05/— | Yes |
| C | 90.86 | 74.7 | 500/500 | 0.05/— | No |
| D | 99.56 | 91.9 | 500/500 | 0.05/0.00 | Yes |
| E | 99.10 | 65.0 | 500/500/250/250/100 | 0.05/0.00/0.10/0.00/0.25 | Yes |

The ability to classify modulations under low signal to-noise ratios (SNR) is one of the crucial abilities of a successful AMC algorithm. The system's performance was tested by measuring $P_{cc}$ as a function of SNR. Through testing, it was discovered that the AMC algorithm described herein degrades gracefully as the SNR decreases and approaches random chance ($P_{cc}$=6) at ≈−20 dB. The performance of each example configuration is shown in FIG. 4.

Figure 4:
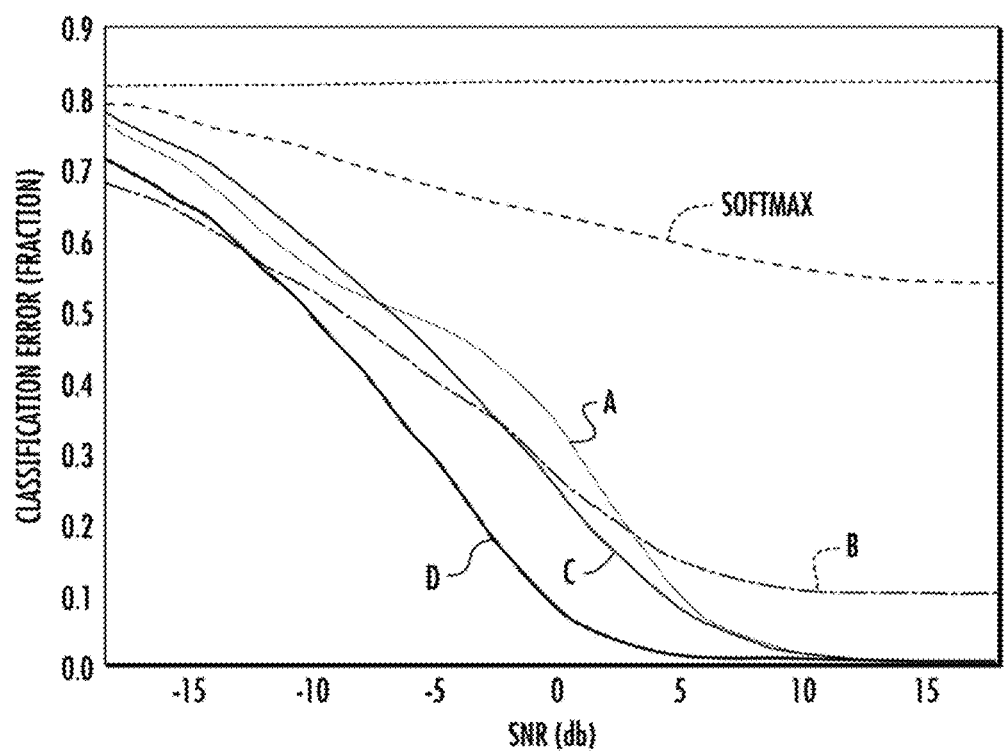
FIG. 4 illustrates classification errors on a test set of samples as a function of a signal to noise ratio (SNR) for different configurations of the classification system having different layers and sparsity constraints according to illustrative embodiments.

FIG. 4 illustrates plots of classification errors on a test set of samples as a function of SNR for different architectures having different layers and sparsity constraints. In FIG. 4, classification errors are shown for an architecture A having one layer with no sparsity constraints or weight decay, an architecture B having one layer with sparsity constraints and weight decay, an architecture C having two layers with no sparsity constraints or weight decay, and an architecture D having 2 layers with sparsity constraints and weight decay. Classification error is also shown for the softmax layer, as represented by the dashed line in FIG. 4.

For each example in the test set, Gaussian noise was added to produce the desired signal-to-noise ratio before presenting the example in the neural network. The architectures represented in FIG. 4 correspond to those listed in Table III, except for configuration E which had substantially worse performance than the other configurations and thus was omitted. The identification error of a random guess is indicated by the horizontal dotted line in FIG. 4. A value of 0.00 corresponds to perfect classification.

As can be seen from FIG. 4, in the absence of weight decay costs (L2 penalties), a single-layer sparse denoising autoencoder (architecture A) performs better than a softmax classifier across the SNR range studied. A single-layer SDA with weight decay (architecture B) substantially improved the generalization of the classifier at higher noise levels, but prevented the network from converging to a reasonable level of accuracy (i.e., $P_{cc} \gg \%$). To allow a better fit of the data to occur, a second layer was added without weight decay or sparsity costs, (architecture C). This improved the overall performance. However, a two-layer sparse stacked denoising autoencoder with weight decay and sparsity costs in layer 2 (architecture D) was found to perform significantly better across all SNRs, with an error rate at 0 dB SNR of 8% and a performance >5 dB better than the closest competitor (architecture C). These results indicate that sparsity, multiple layers, and regularization during further training are important to achieve generalization of the classifier.

For applications to real signals, the magnitude of the integral under the curve in FIG. 4 is somewhat more important than maximal classification accuracy, so architecture D is considered below for further discussion.

The precision and sensitivity of the classifier described herein for each modulation family as a function of the SNR was also examined. Precision is a measure, within the set of samples predicted to have a given modulation, of the fraction that actually have that modulation. Sensitivity is a measure, within the set of samples that actually have a given modulation, of the fraction predicted to have that modulation.

Let $m_i$ and $y_i$ be the true and predicted class label, respectively, for sample i. Then the precision of the classifier for class k is:

$$P_k = \frac{\Sigma[m_i = k \text{ and } y_i = k]}{\Sigma[y_i = k]} \quad (10)$$

and the sensitivity is:

$$S_k = \frac{\Sigma[m_i = k \text{ and } y_i = k]}{\Sigma[m_i = k]} \quad (11)$$

where brackets are the indicator function ([p]=1 if p is true and 0 otherwise).

Figure 5A:
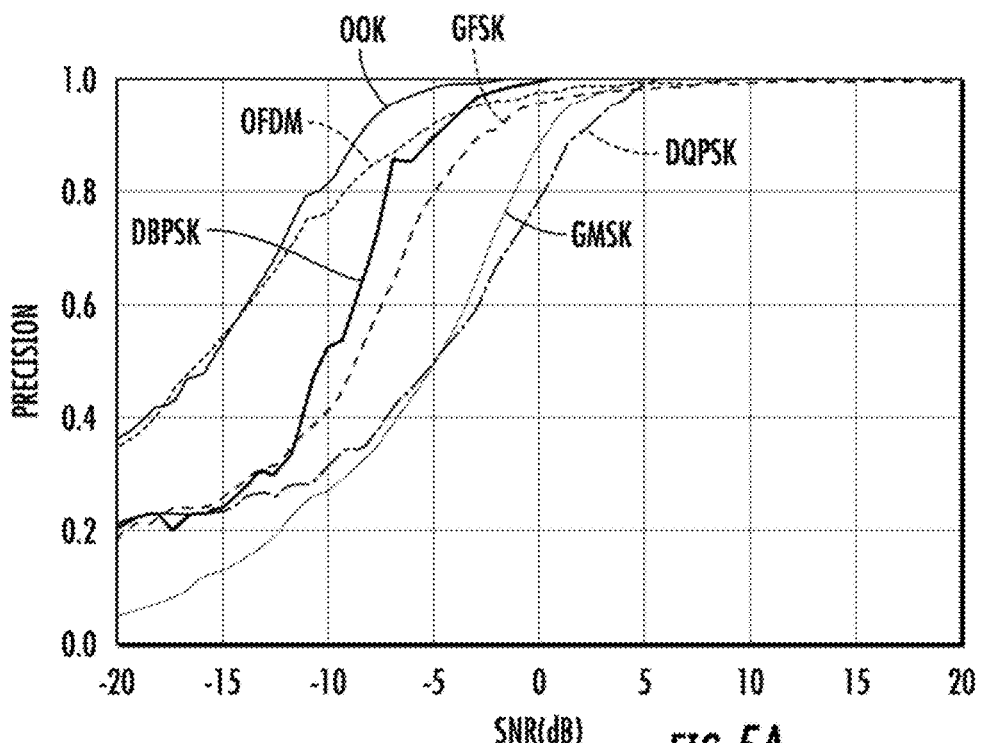
FIGS. 5A and 5B illustrate precision and sensitivity curves, respectively, for each modulation family as a function of a SNR.
Figure 5B:
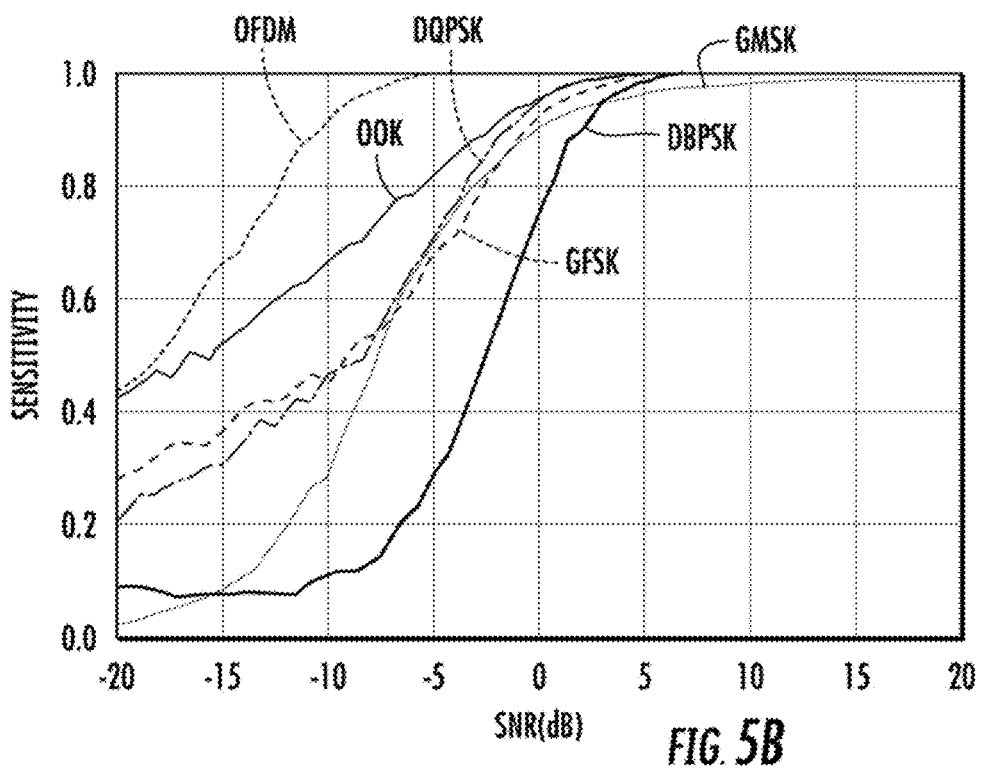

FIGS. 5A and 5B show plots of the precision and sensitivity with respect to SNR of the highest performing classifier (architecture D, Table III), for each of the respective modulation types OOK, OFDM, DBPSK, GFSK, GMSK, and DQPSK. These results confirm that on-off keying (OOK) is extremely robust to noise under this classification system, and that precision (the number of signals predicted to have a given modulation that actually have that modulation) for each modulation family falls off as noise increases. However, sensitivity (the number of correctly identified signals for each modulation) varies much more strongly across the different modulation families. In particular, at −10 dB SNR, sensitivities ranging from 0.1 to 0.9 can be observed, depending on the modulation type.

Although $P_{cc}$ is a good indication of classifier performance overall, it is helpful to identify specific modulation types that may be more or less challenging for our method. To do this, a confusion matrix was constructed of dimension $N_{mod} \times N_{mod}$ consisting of the values of $P_c^{(i'i)}$. FIGS. 6A, 6B, and 6C show the confusion matrix plotted for the classifier architecture with the highest overall performance (architecture D, Table III) at SNRs of −5 dB, 0 dB, and 5 dB, respectively, for each of the modulation types examined. In FIGS. 6A-6C, the darker the square, the better the predicted label (identifying the predicted modulation type) matches the true label (identifying the actual modulation type). As can be seen from these confusion matrices, signals that use on-off keying (OOK) are the easiest to classify, and virtually none are misclassified at these noise levels examined. Of the remaining modulation families, there is some error in all of them as SNR decreases. The classifier tends to over-predict GMSK at the expense of other types. Another error is the confusion of the DQPSK and DBPSK modes at high noise.

The performance of the classifier system according to illustrative embodiments ($P_{cc}$=92% at 0 dB in a 6-way AMC task) is competitive when compared with the performance of AMC using LB or FB methods, as well as ANN-based FB methods. Crucially, unlike existing methods, prior knowledge of modulation design or characteristics is completely unnecessary for the classifier system described herein. Additionally, the methodology described herein was evaluated on sequences of 10 symbols or 100 I/Q time points. This is substantially fewer time points than most existing AMC methods use, and makes the methodology for classifying modulation according to illustrative embodiments more likely to be valuable for classification in dynamically shifting environments.

The use of unsupervised pre-training is crucial to the AMC task. This was observed by exploring the overall classification performance of the SSDA neural network with unsupervised pre-training and L2 regularization (architecture D, Table III) versus a multi-layer perceptron (MLP) trained with dropout and L2 regularization, but without unsupervised pre-training. An MLP architecture was configured with 50% dropout on each layer and L2 regularization as in architecture D. This architecture initially failed to converge over the first 200 epochs (time periods) examined. A sweep was then performed to characterize the parameter sensitivity of the MLP architecture. The convergence of the model was found to be highly sensitive to the learning rate. A change of $1 \times 10^{-5}$ could cause the model to have no improvement over random chance.

Choosing a learning rate of $1.5 \times 10^{-5}$, training was then performed for the same number of epochs as the unsupervised pre-trained architectures. Although the initial convergence rate was similar, the MLP convergence became asymptotic at an error rate of 55%. This asymptotic behavior was observed with stochastic gradient descent with momentum and with other learning rules, such as the Adaptive SubGradient (AdaGrad) rule. These results indicate the challenge of using simple machine learning models to perform AMC. Although it may be possible to configure an MLP such that it would converge for an AMC task, the relative robustness of the system is significantly reduced and the difficulty of parameter selection increases. By using unsupervised pre-training, parameter sensitivity is substantially reduced, and total training time and accuracy are improved.

Regularization is typically prescribed in neural networks to prevent overfitting and to improve generalization. Unsupervised pre-training can also be considered a form of regularization, used to find a starting point such that final generalization error is reduced. However, it has been observed that, in an AMC task, regularization assists in classifying exemplars that are corrupted by effects not found in the training set. This was demonstrated by examining the classification performance of the architectures described herein against a dataset corrupted with additive white Gaussian noise (AWGN), a typical challenge in radio-frequency propagation testing.

When classifying test samples from the test set which have been corrupted by noise, the most heavily regularized and pre-trained network tested (architecture D) exhibited the best overall performance. In the absence of noise, the best performance was observed in the unconstrained single-layer architecture ($P_{cc}$=99.91%). To quantify performance in the presence of noise, SNR required to achieve a performance of a specific $P_{cc}$ can be examined, e.g., $P_{cc}$=90%, or classification error $1-P_{cc}$=10%. By this measure, the unconstrained single-layer network (architecture A) had poorer performance, requiring an SNR of dB to reach $P_{cc}$=90%. The addition of a second layer with constraints (architecture C) results in a modest improvement of 2 dB. When sparse pre-training and L2 regularization are included as constraints (architecture D), the same performance can be achieved at an SNR of −1 dB. This represents an improvement of 6 dB over the unconstrained single-layer network. This corresponds to a 4-fold increase in maximum noise level for a given detection rate.

The addition of sparsity appears to be crucial to this performance increase, and may be a result of forcing the selection of the most valuable receptive fields (rather than simply the ones that best fit the training data). Referring again to FIG. 4, it can be seen that as forms of regularization are incrementally released (e.g., as in architectures A and C), the performance against noisy data (SNR <5 dB) decreased. This is a particularly useful aspect of this implementation of SSDAs, as propagation of digitally-transmitted radio signals through real environments presents a significant modeling challenge. The ability of the AMC methodology described herein to compensate in a model-free way for such noise is highly desirable.

The performance of the single-layer architecture also indicates that addition of such regularizations can have drawbacks that must be compensated for; without a second layer, a fully regularized single-layer network does not converge to adequately high performance levels, as shown by the results or architecture B, described above. However, it does generalize better than an MLP alone in the presence of noise. This may be because it must rely on a limited selection of receptive fields, and with a small network and strong constraints, there may not be enough neurons active to adequately represent the necessary features for classification. These same primitive features, however, may remain intact during signal corruption and thus allow higher low-SNR performance.

It should be appreciated that the size and number of layers in the de-noising autoencoder configuration described herein could be altered, e.g., to allow for a longer time series of I/Q samples to be processed. A deeper architecture with more layers was tested to see if additional layers would improve overall classification, or outweigh the regularization effects and reduce generalization for untrained environmental noise. In prior work on deep neural network architectures, it is typical to find that adding a layer improves performance by less than 1%, and in noise-free conditions this agrees with the results shown in Table III. The deeper model that was tested consisted of architecture D with an additional two layers, subject to similar sparsity constraints (see architecture E, Table III). Interestingly, this model converged to high accuracy very quickly. Thus, the addition of additional pre-trained layers resulted in a rapidly converging, highly accurate classifier. Unfortunately, this configuration also performed substantially worse when exposed to signals in an AWGN channel. This may be a somewhat desirable form of overfitting. That is, by adding additional layers, the classifier becomes highly tuned to the properties of the input set but also may be somewhat inflexible. To improve generalization, one could explore the use of convolutional networks to provide strong regularization (in terms of a limited number of shared receptive fields) while using a deeper representation to achieve high accuracy. It is possible such a network may achieve the rapid convergence seen with the deep SSDA, but without the loss in performance in the presence of unmodeled noise.

Some insights come from studying how the classifier begins to fail under noisy conditions, as can be understood from FIGS. 5A and 5B and FIGS. 6A-6C, referenced above. The confusion matrices shown in FIGS. 6A-6C show the full distribution of $P_c^{(i|i')}$ at selected SNRs, and the precision and sensitivity curves shown in FIGS. 5A and 5B show the full behavior of the marginal distribution.

Recall that precision is a measure, within the set of samples predicted to have a given modulation, of the fraction that actually have that modulation. Sensitivity is a measure, within the set of samples that actually have a given modulation, of the fraction predicted to have that modulation. Precision for a class can be high if only a single example of that class is identified. Sensitivity for a class can be high if every sample in that class is assigned to that class. These results show that the degradation in performance under noise is not random. For example, the classification system systematically over-predicts GMSK (as seen both in the corresponding columns of FIGS. 6A-6C and the GMSK precision curves in FIGS. 5A and 5B). Moreover, these degradations are not simply magnifications of the same errors that exist with no noise. OFDM is the clearest example of this, as the system loses sensitivity to this modulation much more slowly than the other families. This behavior is likely an indicator of "crosstalk" in the receptive fields of the classification system.

Where a traditional AMC architecture would rely on features that are selected for a specific modulation family, the system described herein learns features that are used for classifying multiple families. A single feature vector (receptive field) might play a role in reconstructing or identifying both GMSK and OFDM, for example, and the manner in which these vectors fail to fit noisy versions of their different target families is reflected in the way in which performance does not degrade uniformly for each family. A possible mitigation for this potential crosstalk may be as simple as adding more neurons to the autoencoder layers, as this will increase the number of possible receptive fields that are learned.

The use of unsupervised feature extraction raises an important question with regard to receptive fields. That question is what sort of signal features the classifier system is sensitive to. As explained above, the receptive fields in an autoencoder system are simply the weights between the input layer and the target layer, and they describe the input that maximally excites the target neuron. These features can be thought of as the primitive features of the input.

Through experimentation, it was demonstrated that the biologically-inspired artificial neural network described herein was able to recreate Gabor-like receptive fields when trained on natural images. As those skilled in the art will appreciate, this is a good indicator that the artificial neural network described herein produces accurate classification of input data. This is also an indication that it can be used to generate useful information regarding a non-biological sensory input, e.g., in-phase and quadrature (I/Q) signals acquired in the radio frequency spectrum.

Figure 7:
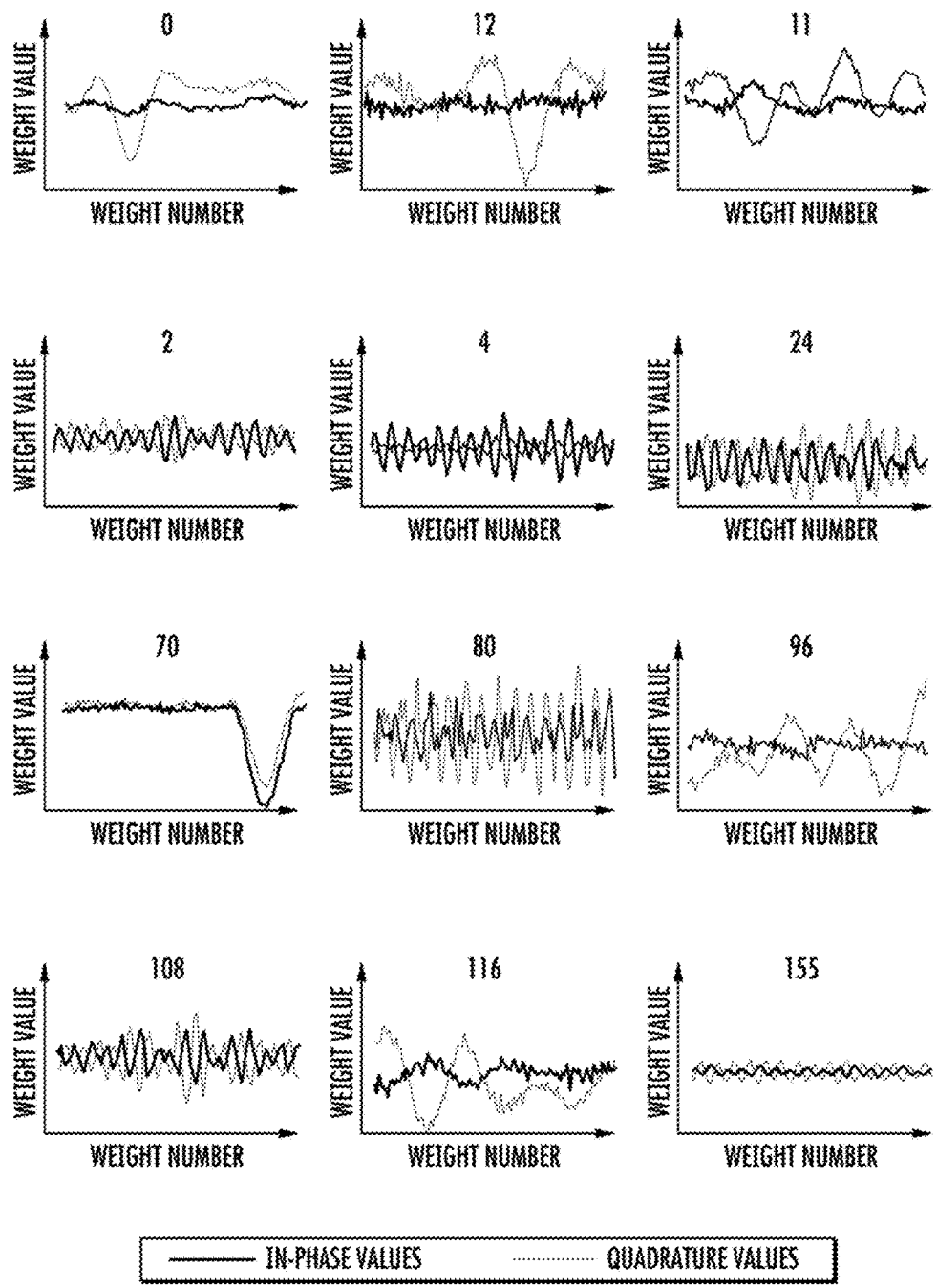
FIG. 7 illustrates examples of weight values of different weight numbers for different neurons generated by training a classification system according to an illustrative embodiment.

FIG. 7 displays graphical representations of the receptive fields of the first layer of an artificial neural network for classifying the modulation type of I/Q modulated signals. Each neuron has a number of different weights corresponding to incoming connections, each different weight has a distinct weight value for the in-phase and quadrature values. This is represented by the numbered traces in FIG. 7. In FIG. 7, the weight values for each corresponding weight number of a neuron are plotted on the y axis and the x axis, respectively.

Though there may be hundreds of neurons in a given classifier system, FIG. 7 shows the weight values of a subset of numbered neurons. For illustrative purposes, the weights or receptive fields for the neurons numbered 0, 12, 11, 2, 4, 24, 70, 80, 96, 108, 116 and 115 are shown in FIG. 7. The weights shown in FIG. 7 represent a neural network that was trained with radio signal data consisting of two channels (I, Q) of information per sample. The I and Q channels are shown in different shades, with the I channel being darker than the Q channel. Each plot of weight values represents the shape of the "feature" that the neuron is sensitive to. The output of the neuron is a scalar value indicating the strength of the match between a feature of the input and the feature that the neuron is sensitive to. The probability that the input signal of a neural network belongs to a particular known modulation class may be determined based the strengths of the matches of features of the input signal to the features that the neurons of the neural network are sensitive to.

The receptive fields shown in FIG. 7, which show weight values naturally learned without supervision (and later fine-tuned with supervision), represent a significant difference between the classifier system and method described herein and prior work with artificial neural network (ANN) based automatic modulation schemes. While other systems have used single layer and multi-layer ANNs to achieve impressive performance (as high as 97% accuracy at 0 dB in a 10-way classification task), these methods required expert construction of features specific to each modulation, making them inflexible.

Figure 8:
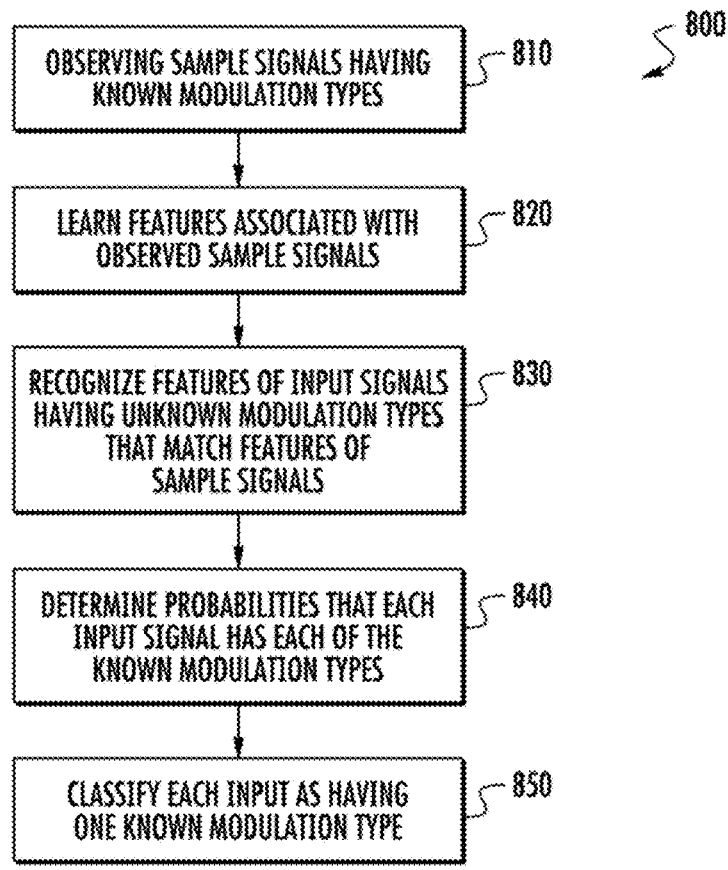
FIG. 8 is a flow chart showing steps in a process for classifying modulation types according to illustrative embodiments.

FIG. 8 is a flow chart showing steps in a process for classifying a modulation type of an input signal according to illustrative embodiments. It should be appreciated that the steps and order of steps described and illustrated are provided as examples. Fewer, additional, or alternative steps may also be involved in the process for classifying a modulation type of an input signal, and/or some steps may occur in a different order.

Referring to FIG. 8, the process 800 begins at step 810 at which sample signals are observed having known modulation types. These sample signals may include I/Q modulated signals 210 that have been converted into vector form 220. At step 820, features associated with the observed sample signals are learned by the autoencoder 230. This step includes unsupervised training by the autoencoder 230 to adjust the weights of the connections of the autoencoder 230 and supervised training by the softmax 250 to refine the weights as described in detail above with reference to FIGS. 2A and 2B.

Once trained, at step 830, the autoencoder 230 recognizes features of input signals having unknown modulation types that at least partially match at least some of the features of the sample signals having known modulation types. At step 840, the softmax 250 determines probabilities that each input signal has each of the known modulation types. This determination is made based on the outputs of the autoencoder 230 indicative of the strengths of the matches between the recognized features of the input signals and the features of the sample signals having known modulation types. At step 850, the softmax 250 classifies each input signal has having one of the known modulation types based on the highest determined probability.

Although the process illustrated in FIG. 8 is directed to classifying the modulation types of input signals, it should be appreciated that the process could be used to identify the types of signals having rapidly varying time series, such as vibrational data, data from gyroscopic or inertial navigation systems, data from computer systems, and data from energy grids. Further the methodology may be used to learn features of new modulation types, in addition to known modulation types.

It should further be appreciated that, although the process described above is directed to the analysis of one data stream of radio samples, the system and methodology described herein could be used to simultaneously analyze and classify multiple incoming data streams. The data streams could all be of the same type of data, e.g., I/Q modulated radio data from several phased antennas. The data could also be of different types, for example, I/Q modulated radio data and inertial navigation system data.

It should further be appreciated that the unsupervised training phase described above, which could be based on measure or synthetic data sources, could be replace with other methods of setting the autoencoder weights. This could be important in situations where compartmentalization of information is of great importance. In such situations, the autoencoder weights could be prepared at a high security level based on compartmentalized information. Once trained, the system and methodology descried herein could be could be deployed in a lower-security area.

Figure 9:
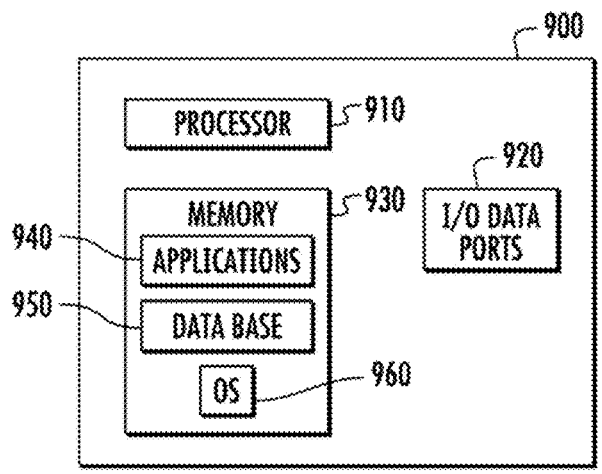
FIG. 9 illustrates an example of a computing device with which a system for classifying modulation types may be implemented according to illustrative embodiments.

FIG. 9 is a block diagram of a computing device with which the classifier system may be implemented, according to illustrative embodiments. Although no connections are shown between the components illustrated in FIG. 9, those skilled in the art will appreciate that the components can interact with each other via any suitable connections to carry out device functions.

The term "application", or variants thereof, is used expansively herein to include routines, program modules, program, components, data structures, algorithms, and the like. Applications can be implemented on various system configurations, including single-processor or multiprocessor systems, minicomputers, mainframe computers, personal computers, handheld-computing devices, microprocessor-based, programmable consumer electronics, combinations thereof, and the like. The terminology "computer-readable media" and variants thereof, as used in the specification and claims, includes non-transitory storage media. Storage media can include volatile and/or non-volatile, removable and/or non-removable media, such as, for example, RAM, ROM, EEPROM, flash memory or other memory technology, CDROM, DVD, or other optical disk storage, magnetic tape, magnetic disk storage, or other magnetic storage devices or any other medium that can be used to store information that can be accessed.

Referring to FIG. 9, the computing device 900 may be implemented in any suitable computing device, e.g., a consumer laptop. The computing device 900 includes a processor 910 that receives inputs and transmits outputs via I/O Data Ports 920. The I/O Data Ports 920 can be implemented with, e.g., any suitable interface through which data and signals may be received and transmitted wired and/or wirelessly. For example, the inputs may include radio samples, and the outputs may include labels identifying classified modulations types of the input radio samples.

Although not shown, the computing device 900 may also include a physical hard drive. The processor 910 communicates with the memory 930 and the hard drive via, e.g., an address/data bus (not shown). The processor 910 can be any commercially available or custom microprocessor. The memory 930 is representative of the overall hierarchy of memory devices containing the software and data used to implement the functionality of the device 900. The memory 930 can include, but is not limited to the types of memory devices described above. As shown in FIG. 9, the memory 930 may include several categories of software and data used in the device 900, including applications 940, a database 950, an operating system (OS) 960, etc.

The applications 940 can be stored in the memory 930 and/or in a firmware (not shown) as executable instructions, and can be executed by the processor 910. The applications 940 include various programs that implement the various features of the device 900. For example, the applications 940 may include applications to implement the functions of the autoencoder 230 and the softmax 240 (including pre-processing, training, and post-training classification0, as well as an application to convert input radio samples to a vector.

The database 950 represents the static and dynamic data used by the applications 940, the OS 960, and other software programs that may reside in the memory. The database may 950 may be used to store various data including data needed to execute the applications 940, e.g., data indicative of different modulation types.

While the memory 930 is illustrated as residing proximate the processor 910, it should be understood that at least a portion of the memory 930 can be a remotely accessed storage system, for example, a server on a communication network, a remote hard disk drive, a removable storage medium, combinations thereof, and the like.

It should be understood that FIG. 9 and description above are intended to provide a brief, general description of a suitable environment in which the various aspect of some embodiments of the present disclosure can be implemented. While the description includes a general context of computer-executable instructions, the present disclosure can also be implemented in combination with other program modules and/or as a combination of hardware and software in addition to, or instead of, computer readable instructions. For example, the classifier system could be implemented in whole or in part on specialized hardware, for example in a field-programmable gate array in order to achieve faster computation times.

Unsupervised training methods such as those presented according to illustrative embodiments of the invention allow for much greater flexibility in terms of incorporating unusual characteristics of environmental noise, accommodating signals for which no detailed model may be available, and in adapting to changes in environmental or signal characteristics over time through the use of on-line learning techniques. ANN based methods are also actively being researched for use within the radio front-end processing stages. One example is to use a multilayer perceptron for channel equalization. These efforts are orthogonal and may be potentially complementary to the methodology described herein.

In considering complementary domains and methods, it should be noted that the task of automatic modulation classification for radio signal data is conceptually similar to tasks from related fields, such as phoneme or word detection in speech processing, although the domain presents unique challenges in terms of sample rate and robustness to noisy environments. It is also noted that recent work in acoustic modeling with deep networks has found that significant improvements are possible by leveraging up to 7 layers of autoencoder units, and the architecture presented herein will likely permit many more optimizations. Additional improvements may come in the form of convolutional autoencoders. For example, as can be seen in FIG. 7 (receptive fields 0 and 12), some of the low-level features may be time-shifted variants of each other. This implies that convolutional application of those features to streaming inputs may provide performance and computational cost improvements.

Another possible route towards improved performance, especially in the application to streaming or online analysis, is the implementation of the architecture described herein as a spiking neural network. Spiking neural networks (SNNs) are another step towards biologically-relevant systems, as they seek to represent information as discrete temporal events much like biological nervous systems do with action potentials. SNNs can natively represent information contained in signal timing with higher resolution than clocked systems of equivalent sophistication, and open up a much larger parameter space for encoding information. They provide new opportunities for unsupervised learning (spike-timing dependent plasticity, optimization (spiking neuron models), and efficient bandwidth usage (spike coding). Architecture D (Table III) has been implemented as SNN with near-identical performance on the same task described here in full spiking simulation.

As the persistence and level of the sparsity constraints increase, the general performance the classifier system described herein improves in environmental conditions under which the classifier was not specifically trained. Under no noise, all explored architectures that successfully converge perform similarly well, but it was found that biologically motivated principles result in a system which performs markedly better under environmental noise. This is particularly interesting in light of the prevailing explanations for the sparse coding principle, among them robustness to environmental noise. The results presented herein indicate that this principle is still valid and useful in problem domains that are rarely associated with sensing by natural organisms. Importantly, biologically-inspired sensing principles, implemented using hierarchical neural networks, do not require a biologically-inspired input. This suggests that other areas for which both machine and human perception are limited (e.g., network traffic, equipment temperature, and data from power grids) may benefit from application of the methods proposed herein.

The results of the architecture and methodology described herein differ from much prior work in neural-network processing of time-varying signals (speech recognition, for example) by focusing narrowly on ingesting raw waveform data, rather than spectrogram or filter bank features, and extracting useful features for later tasks. Even relatively simple networks can do useful processing of radio signals with extremely limited samples and in the presence of environmental noise. The results also differ from the prior work in AMC, as they do not make use of expert knowledge and can construct effective features that adapt to both signals and the propagation environment with competitive performance. This opens up new opportunities for efficient use of an increasingly complex electromagnetic signaling environment. Biologically-inspired feature extraction, in the form of sparsity and unsupervised pre-training, can enhance neural-network AMC even under noise conditions not modeled in the training data.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A method for automatically determining class types of input signals having unknown class types, comprising:
   a) learning, by a neural network including multiple stacked sparse denoising autoencoders (SSDA) with weighted connections, features associated with a plurality of different observed signals having respective different known class types, wherein step a) comprises adjusting assigned weights of the connections based on the features of the plurality of different observed signals;
   b) refining, by a softmax component, the adjusted weights of the connections based on outputs of the SSDA;
   c) recognizing, by the SSDA, features of the input signals having unknown class types that at least partially match at least some of the features associated with the plurality of different observed signals having respective different known class types;
   d) determining, by the softmax component, probabilities that each of the input signals have each of the known class types based on strengths of matches between recognized features of each of the input signals and the features associated with the plurality of different observed signals; and
   e) classifying, by the softmax component, each of the input signals as having one of the respective different known class types based on a highest determined probability for each input signal in a manner that is accurate in noisy environments.

2. The method of claim 1, wherein the class types are modulation types.

3. The method of claim 1, wherein adjusting the assigned weights of the connections includes comparing outputs of the SSDA to corresponding inputs and adjusting the assigned weights of the connections automatically based on a difference between the outputs and the corresponding inputs.

4. The method of claim 3, wherein the assigned weights are repeatedly adjusted to minimize the difference between the outputs and the corresponding inputs.

5. The method of claim 1, wherein refining the adjusted weights of the connections includes estimating, for each output of the SSDA, a probability that the output has a known class type, determining whether the estimated probability is correct, and repeatedly refining the adjusted weights of the connections until the estimated probability is substantially correct.

6. A system for automatically determining modulation types of input signals having unknown modulation types, comprising:
   multiple stacked sparse denoising autoencoders (SSDA) with weighted connections, the SSDA configured to:
      during a training phase, learn features associated with a plurality of different observed signals having different respective known modulation types and adjusting assigned weights of the connections based on the features of the plurality of different observed signals; and
      during a classification phase, recognize features of the input signals that at least partially match at least some of the features associated with the plurality of different observed signals having different respective known modulation types and produce outputs indicative of strengths of the matches of the recognized features of the input signals with the features associated with the plurality of different observed signals; and
   a softmax component configured to:
      during the training phase, refine the adjusted weights of the connections based on outputs of the SSDA; and
      during the classification phase, determine probabilities that each of the input signals has each of the known modulation types based on outputs of the SSDA and classify each of the input signals as having one of the different respective known modulation types based on a highest determined probability for each input signal in a manner that is accurate in noisy environments.

7. The system of claim 6, wherein, during the training phase, the SSDA adjusts the assigned weights of the connections by comparing outputs of SSDA to corresponding inputs and adjusting the assigned weights of the connections automatically based on a difference between the outputs and the corresponding inputs.

8. The system of claim 7, wherein the assigned weights of the connections are repeatedly adjusted until the outputs of the SSDA are substantially the same as the corresponding inputs.

9. The system of claim 6, wherein the softmax component refines the adjusted weights of the connections by estimating, for each output of the SSDA, a probability that the output has a known modulation type, determining whether the estimated probability is correct, and repeatedly refining the adjusted weights of the connections of the SSDA until the estimated probability is substantially correct.

* * * * *